(12) United States Patent
Wang et al.

(10) Patent No.: US 11,298,727 B2
(45) Date of Patent: Apr. 12, 2022

(54) SUBSTRATE CLEANING APPARATUS

(71) Applicant: ACM Research (Shanghai) Inc., Shanghai (CN)

(72) Inventors: Hui Wang, Shanghai (CN); Jun Wu, Shanghai (CN); Cheng Cheng, Shanghai (CN); Xi Wang, Shanghai (CN); Zhenming Chu, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 134 days.

(21) Appl. No.: 16/499,705

(22) PCT Filed: Mar. 30, 2017

(86) PCT No.: PCT/CN2017/078732
§ 371 (c)(1),
(2) Date: Sep. 30, 2019

(87) PCT Pub. No.: WO2018/176306
PCT Pub. Date: Oct. 4, 2018

(65) Prior Publication Data
US 2021/0187563 A1 Jun. 24, 2021

(51) Int. Cl.
*B08B 3/12* (2006.01)
*H01L 21/67* (2006.01)
(Continued)

(52) U.S. Cl.
CPC .................. *B08B 3/12* (2013.01); *G03F 1/82* (2013.01); *H01L 21/67051* (2013.01); *H01L 21/68728* (2013.01)

(58) Field of Classification Search
CPC ....... B08B 3/12; G03F 1/82; H01L 21/67051; H01L 21/68728
See application file for complete search history.

(56) References Cited

U.S. PATENT DOCUMENTS 6,115,867 A * 9/2000 Nakashima ....... H01L 21/67046
15/77
6,431,184 B1 * 8/2002 Taniyama ................. B08B 3/12
134/1.3
(Continued)

FOREIGN PATENT DOCUMENTS

CN 1794430 A 6/2006
CN 1923381 A 3/2007
(Continued)

OTHER PUBLICATIONS

International Search Report issued in corresponding International Application No. PCT/CN2017/078732 dated Jan. 5, 2018 (4 pages).
(Continued)

*Primary Examiner* — Benjamin L Osterhout
(74) *Attorney, Agent, or Firm* — Osha Bergman Watanabe & Burton LLP

(57) ABSTRACT

A substrate cleaning apparatus, including a chuck assembly, at least one first nozzle (107,207), and an ultra or mega sonic device (206,306). The chuck assembly is configured to receive and clamp a substrate. The at least one first nozzle (107,207) is configured to spray liquid onto the top surface of the substrate. The ultra or mega sonic device (206,306) is configured to dispose above the top surface of the substrate for providing an ultra or mega sonic cleaning to the substrate. A gap is formed between the ultra or mega sonic device (206,306) and the top surface of the substrate, and the gap is fully and continuously filled with the liquid so that the entire underneath of the ultra or mega sonic device (206, 306) is filled with the liquid all the time during the cleaning process.

14 Claims, 19 Drawing Sheets

(51) Int. Cl.
*G03F 1/82* (2012.01)
*H01L 21/687* (2006.01)

(56) References Cited

U.S. PATENT DOCUMENTS

| | | | |
|---|---|---|---|
| 2002/0006876 A1* | 1/2002 | Hongo | H01L 21/6719 156/345.12 |
| 2002/0066475 A1* | 6/2002 | Verhaverbeke | H01L 21/68728 134/153 |
| 2004/0238000 A1* | 12/2004 | Yeo | H01L 21/67051 134/1.3 |
| 2006/0234503 A1* | 10/2006 | Yamada | C23C 18/1628 438/667 |
| 2007/0044823 A1 | 3/2007 | Yamamoto et al. | |
| 2009/0050175 A1* | 2/2009 | Tanaka | B08B 3/12 134/1 |
| 2010/0139710 A1* | 6/2010 | Wang | B08B 3/12 134/34 |
| 2010/0147336 A1* | 6/2010 | Obweger | H01L 21/67259 134/34 |
| 2011/0290277 A1* | 12/2011 | Wang | H01L 21/02063 134/1.3 |
| 2012/0145204 A1* | 6/2012 | Lin | H01L 21/67051 134/140 |
| 2013/0233361 A1 | 9/2013 | Egashira | |
| 2015/0270146 A1* | 9/2015 | Yoshihara | H01L 21/67103 134/18 |
| 2016/0279678 A1 | 9/2016 | Yoshitomi et al. | |
| 2017/0138911 A1* | 5/2017 | Deng | H01L 21/67253 |

FOREIGN PATENT DOCUMENTS

| | | |
|---|---|---|
| CN | 103311156 A | 9/2013 |
| CN | 106024581 A | 10/2016 |
| JP | S62166517 A | 7/1987 |
| JP | H09199458 A | 7/1997 |
| JP | 2001104893 A | 4/2001 |
| JP | 2004095705 A | 3/2004 |
| JP | 2007150172 A | 6/2007 |
| JP | 2011210933 A | 10/2011 |
| JP | 2012511813 A | 5/2012 |
| JP | 2013016857 A | 1/2013 |
| JP | 2013168422 A | 8/2013 |
| WO | 2016183707 A1 | 11/2016 |

OTHER PUBLICATIONS

Written Opinion issued in corresponding International Application No. PCT/CN2017/078732 dated Jan. 5, 2018 (3 pages).
Office Action issued in corresponding JP Application No. 2019-553937 with English translation dated Feb. 16, 2021 (14 pages).
Office Action issued in corresponding SG Application No. 11201909037T dated Oct. 5, 2020 (9 pages).
Office Action issued in corresponding CN Application No. 201780089141.7 dated Jul. 1, 2021 (8 pages).
Office Action issued in corresponding KR Application No. 10-2019-7031665 with English translation dated Oct. 15, 2021 (13 pages).

* cited by examiner

SUBSTRATE CLEANING APPARATUS

FIELD OF THE INVENTION

The present invention relates to an apparatus for cleaning substrates such as masks by using an ultra or mega sonic device.

BACKGROUND

Although the development of semiconductor technology has been more than half a century from the first transistor coming out, now it still maintains a strong momentum of development, which continues to follow the Moore law that the chip integration is doubled every eighteen months, and the size of semiconductor devices shrinks 0.7 times every three years. Moreover, the diameter of semiconductor wafers has reaches 300 mm. That large size, fine line width, high precision, high efficiency, and low cost of IC production brings an unprecedented challenge to semiconductor equipment.

In the process of manufacturing semiconductor devices, multiple lithography processes are an essential part of this process. Through such as exposure and selective chemical etching, integrated circuit pattern on a mask is printed onto the semiconductor wafer. In the lithography process, the mask is essential and plays a key role. The mask is a high precision tool for pattern transfer in the semiconductor device manufacturing process. Generally, the mask is repeatedly used. After the mask is used repeatedly for a plurality of times, the mask becomes dirty (residual resist, dust, fingerprint, etc.). Therefore, the mask needs to be cleaned. In the 65 nm and below nodes, the mask cleaning becomes even more critical. Whether the mask is clean will affect the quality and yield of the semiconductor devices. At present, there are several ways to clean the mask. One way is using surfactant and manual scrub to clean the mask. Another way is using acetone, alcohol, ultrapure water to clean the mask. Another way is using cleaning liquid to immerse the mask, combined with ultrasonic oscillation. However, the effect of said ways to remove contaminates on the mask is not ideal.

SUMMARY

Accordingly, an object of the present invention is to provide an apparatus for cleaning substrates, which can improve the cleaning effect of the substrates.

According to one embodiment, an apparatus for cleaning substrates includes a chuck assembly, at least one first nozzle, and an ultra or mega sonic device. The chuck assembly is configured to receive and clamp a substrate. The at least one first nozzle is configured to spray liquid onto the top surface of the substrate. The ultra or mega sonic device is configured to dispose above the top surface of the substrate for providing an ultra or mega sonic cleaning to the substrate. A gap is formed between the ultra or mega sonic device and the top surface of the substrate, and the gap is fully and continuously filled with the liquid so that the entire underneath of the ultra or mega sonic device is filled with the liquid all the time during the cleaning process.

In the present invention, the chuck assembly includes a chuck having a receiving cavity for holding a substrate. A mask is placed in the receiving cavity of the chuck so that the mask can be seen as a part of the chuck. The underneath of the ultra or mega sonic device is over against the top surface of the mask and the top surface of the chuck and the gap between the ultra or mega sonic device and the top surface of the mask and the top surface of the chuck is fully and continuously filled with the liquid. The entire underneath of the ultra or mega sonic device is filled with the liquid all the time during the cleaning process. The ultra or mega sonic energy is stably transferred to the top surface of the mask through the liquid. Therefore, the entire top surface of the mask achieves a uniform ultra or mega sonic power density distribution, which improves the cleaning effect of the mask, especially improves the cleaning effect of edges of the mask.

DETAILED DESCRIPTION

Figure 6:
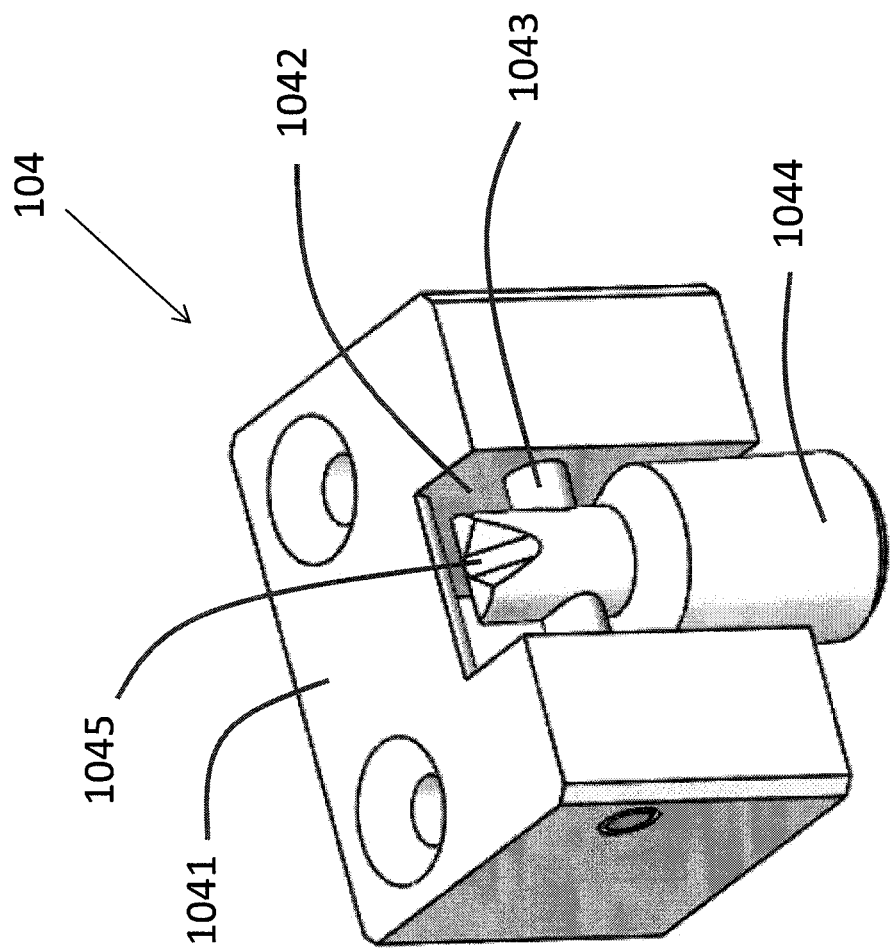
FIG. 6 is a perspective view of a clamp device.
Figure 7:
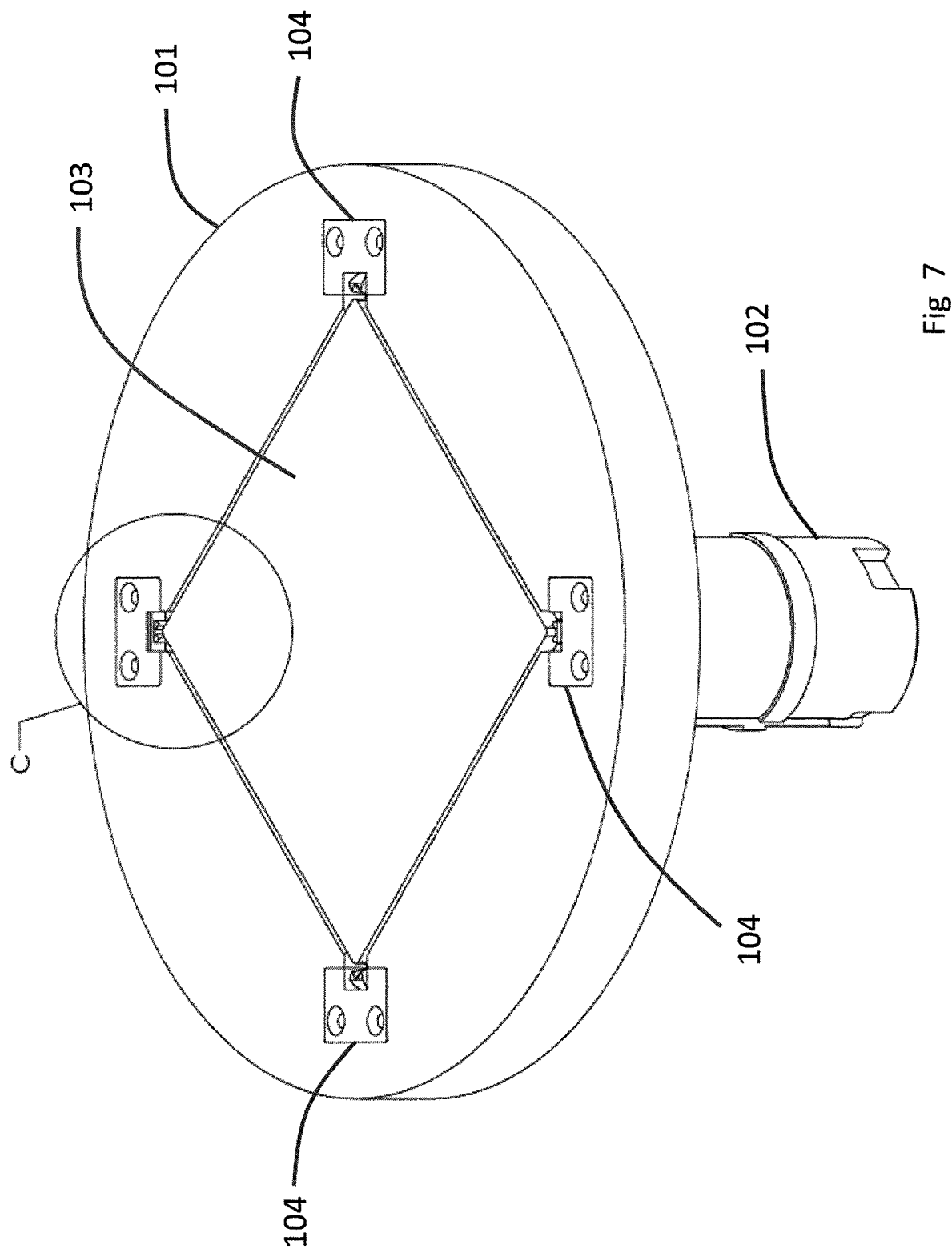
FIG. 7 is a perspective view of the apparatus used for cleaning a mask.
Figure 8:
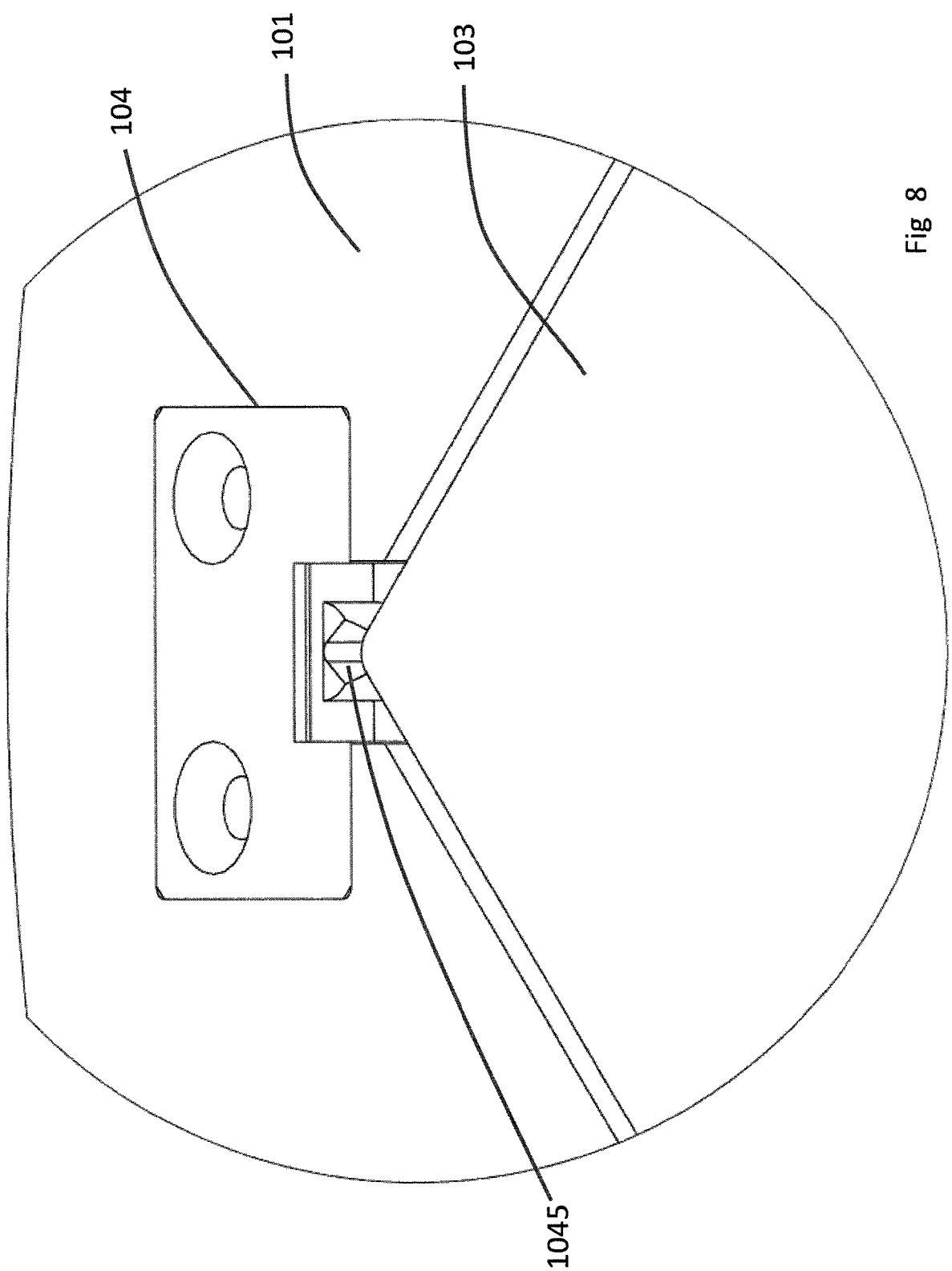
FIG. 8 is a partial enlarged view of a portion C of FIG. 7.
Figure 9:
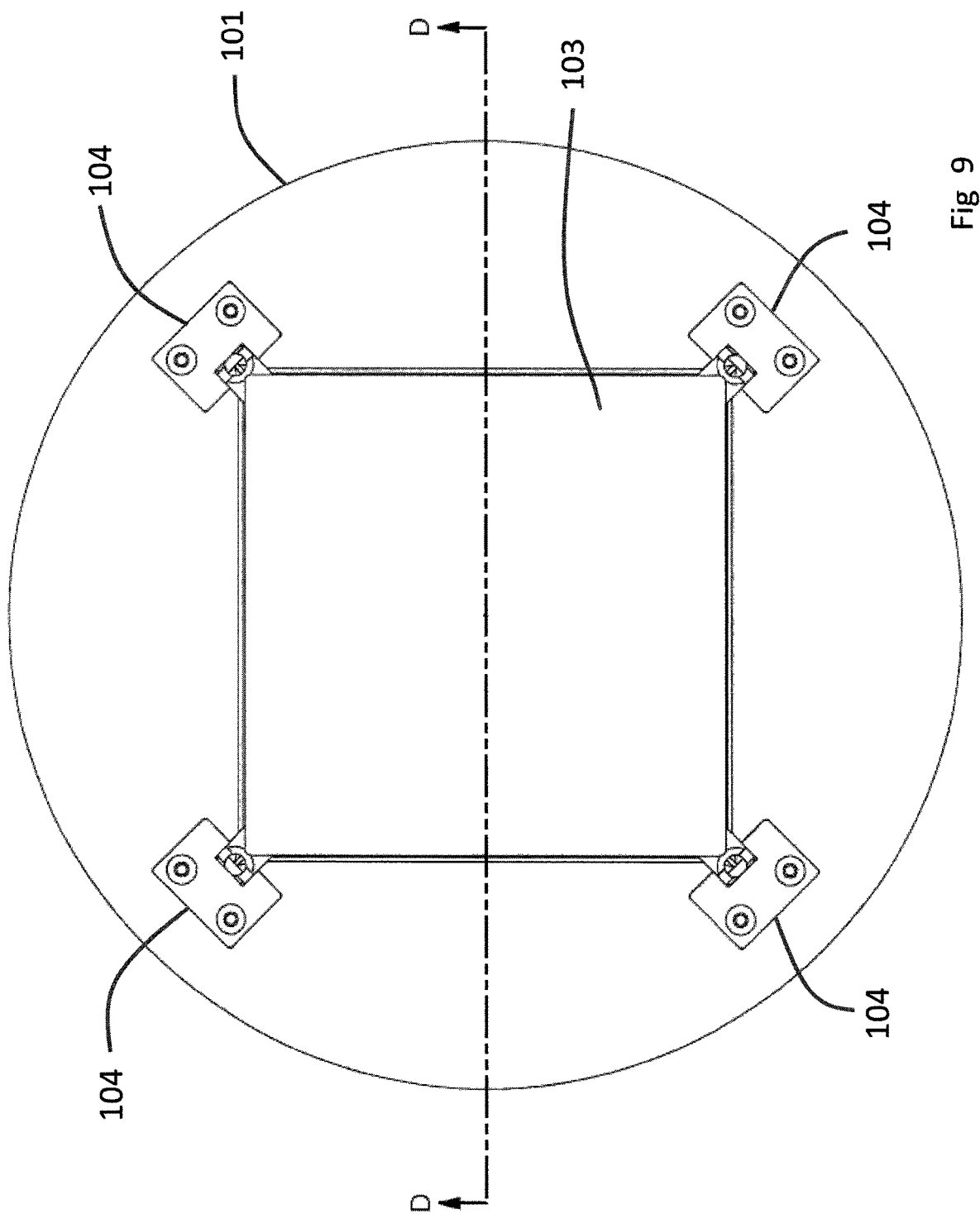
FIG. 9 is a top view of the apparatus used for cleaning the mask.
Figure 10:
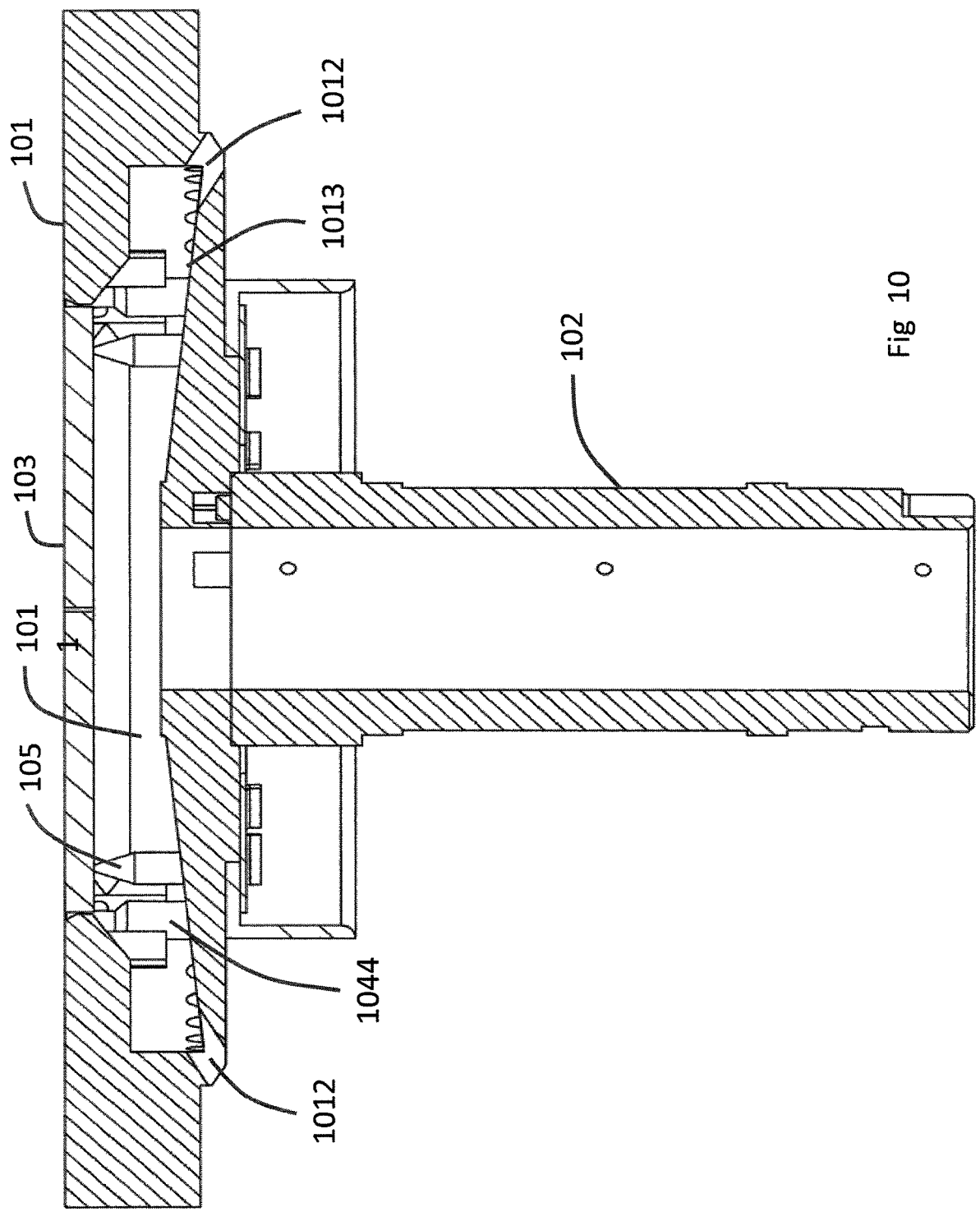
FIG. 10 is a cross-sectional view taken along line D-D of FIG. 9.
Figure 11:
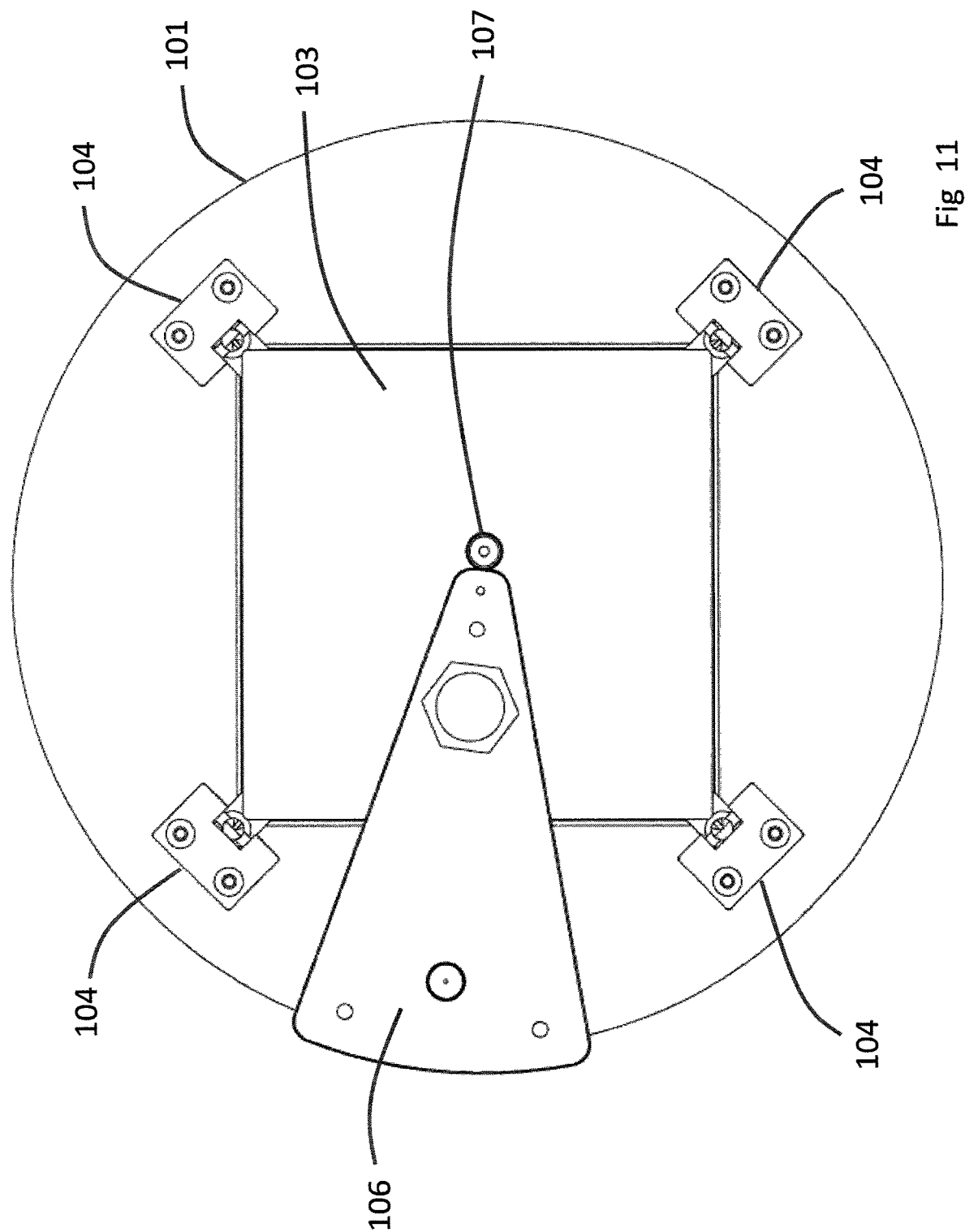
FIG. 11 is a top view of the apparatus combined with an ultra or mega sonic device for cleaning the mask.
Figure 12:
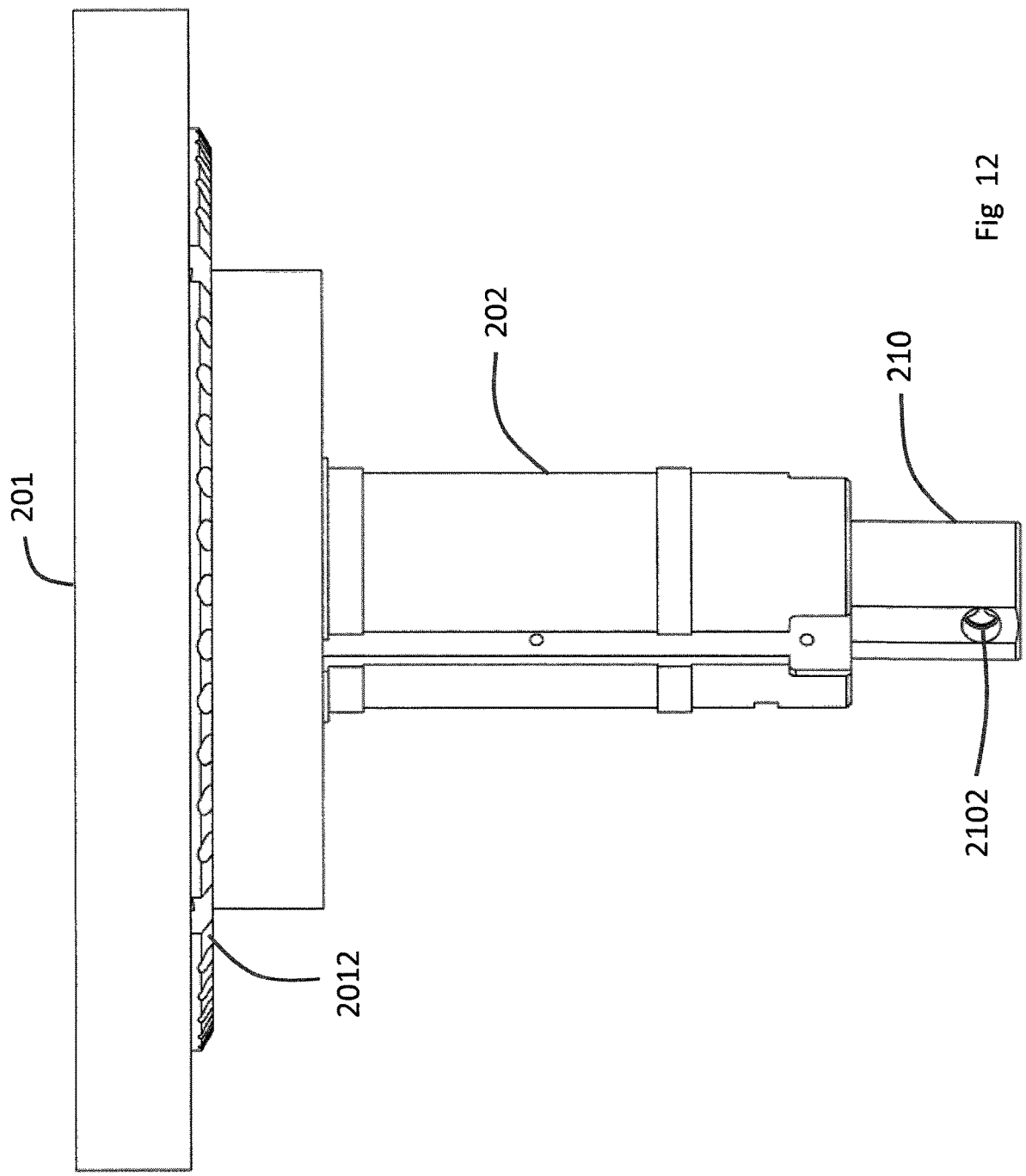
FIG. 12 is a front view of an apparatus for cleaning substrates according to a second exemplary embodiment of the present invention.
Figure 13:
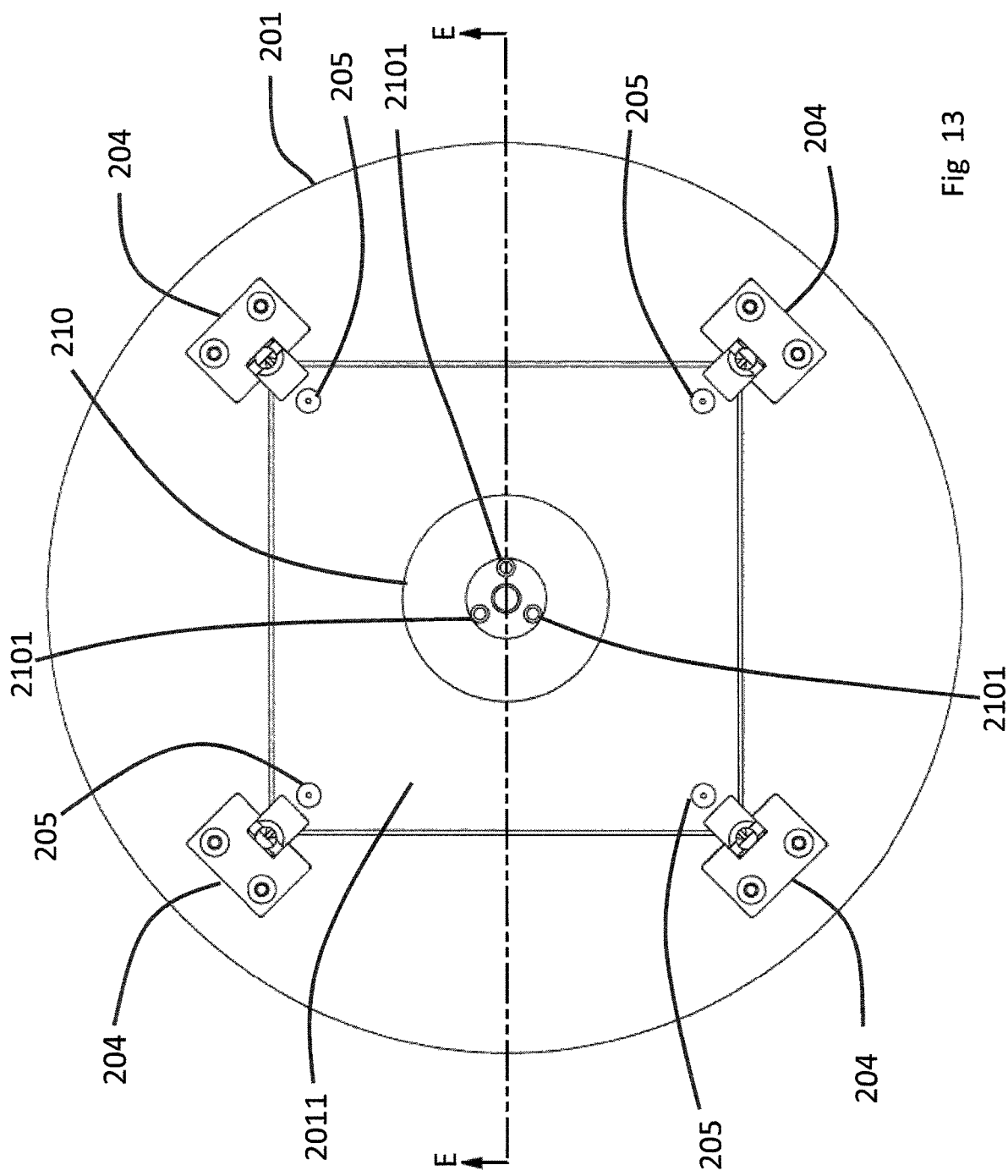
FIG. 13 is a top view of the apparatus shown in FIG. 12.

Referring to FIG. 1 to FIG. 11, an apparatus for cleaning substrates using an ultra or mega sonic device according to a first embodiment of the present invention is illustrated. The apparatus includes a chuck assembly for receiving and clamping a substrate. Specifically, the chuck assembly includes a chuck 101, a rotating spindle 102 fixed with the chuck 101, a rotating driving mechanism, supporting pins 105 and clamp devices 104. The rotating spindle 102 connects to the rotating driving mechanism. The rotating driving mechanism drives the rotating spindle 102 and the chuck 101 to rotate. The chuck 101 has a receiving cavity 1011 for holding a substrate such as a mask 103. The opening shape of the receiving cavity 1011 is substantially square which matches with the shape of the mask 103. It should be recognized that the opening shape of the receiving cavity 1011 matches with the shape of the substrate which is not limited to the mask 103 and also is not limited to the square shape. The chuck 101 has four vertical planes 1015 which are configured to form the opening of the receiving cavity 1011. Preferably, in order to facilitate placing the mask 103 in the receiving cavity 1011, the chuck 101 has four guiding planes 1014 which respectively connect to the four vertical planes 1015. Four clamp devices 104 are mounted on the chuck 101 and located at four corners of the receiving cavity 1011 for clamping the mask 103. As shown in FIG. 6, every clamp device 104 has a pedestal 1041 which is fixed on the chuck 101. The pedestal 1041 defines an opening 1042, and a shaft 1043 transversely passes through the opening 1042 and two ends of the shaft 1043 are fixed on the pedestal 1041. A clamp pin 1044 is hung on the shaft 1043. The clamp pin 1044 is located at the opening 1042 and can rotate around the shaft 1043. The top end of the clamp pin 1044 defines a substantial right-angle slot 1045 for matching with the corner of the mask 103. The interior of the clamp pin 1044 sets a heavy block of which material is stainless steel. The density of the material which is made for the clamp pin 1044 is lower than the density of the material which is made for the heavy block. When the rotating speed of the chuck 101 is higher than a threshold, the clamp pin 1044 clamps the mask 103 by means of centrifugal force. When the rotating speed of the chuck 101 is lower than the threshold, the clamp pin 1044 returns to its original position by its own gravity and releases the mask 103. Four supporting pins 105 are disposed in the receiving cavity 1011 of the chuck 101 for supporting the mask 103. The four supporting pins 105 are located at the four corners of the receiving cavity 1011 and corresponding to the four clamp pins 1044.

Figure 1:
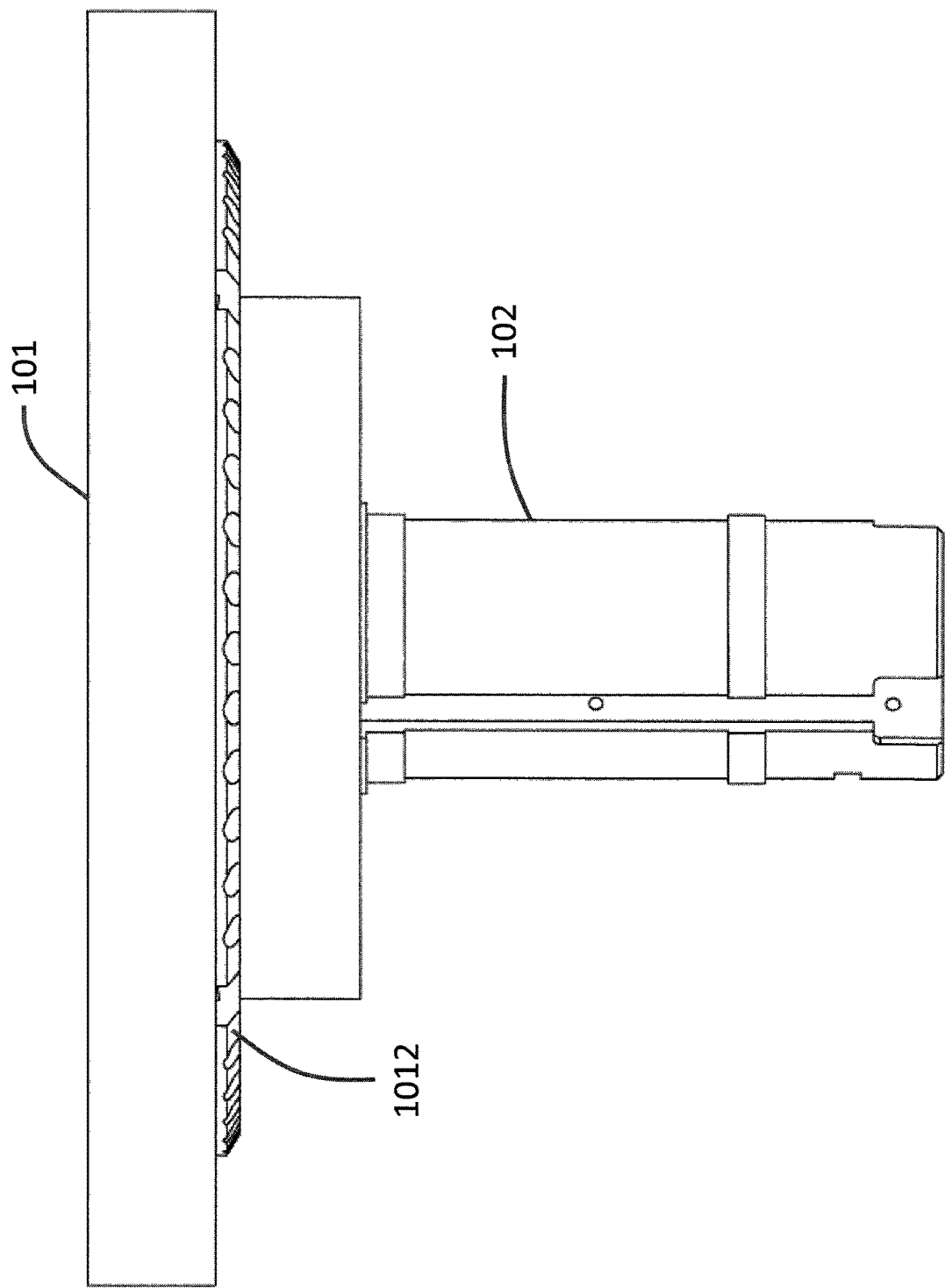
FIG. 1 is a front view of an apparatus for cleaning substrates according to a first exemplary embodiment of the present invention.
Figure 2:
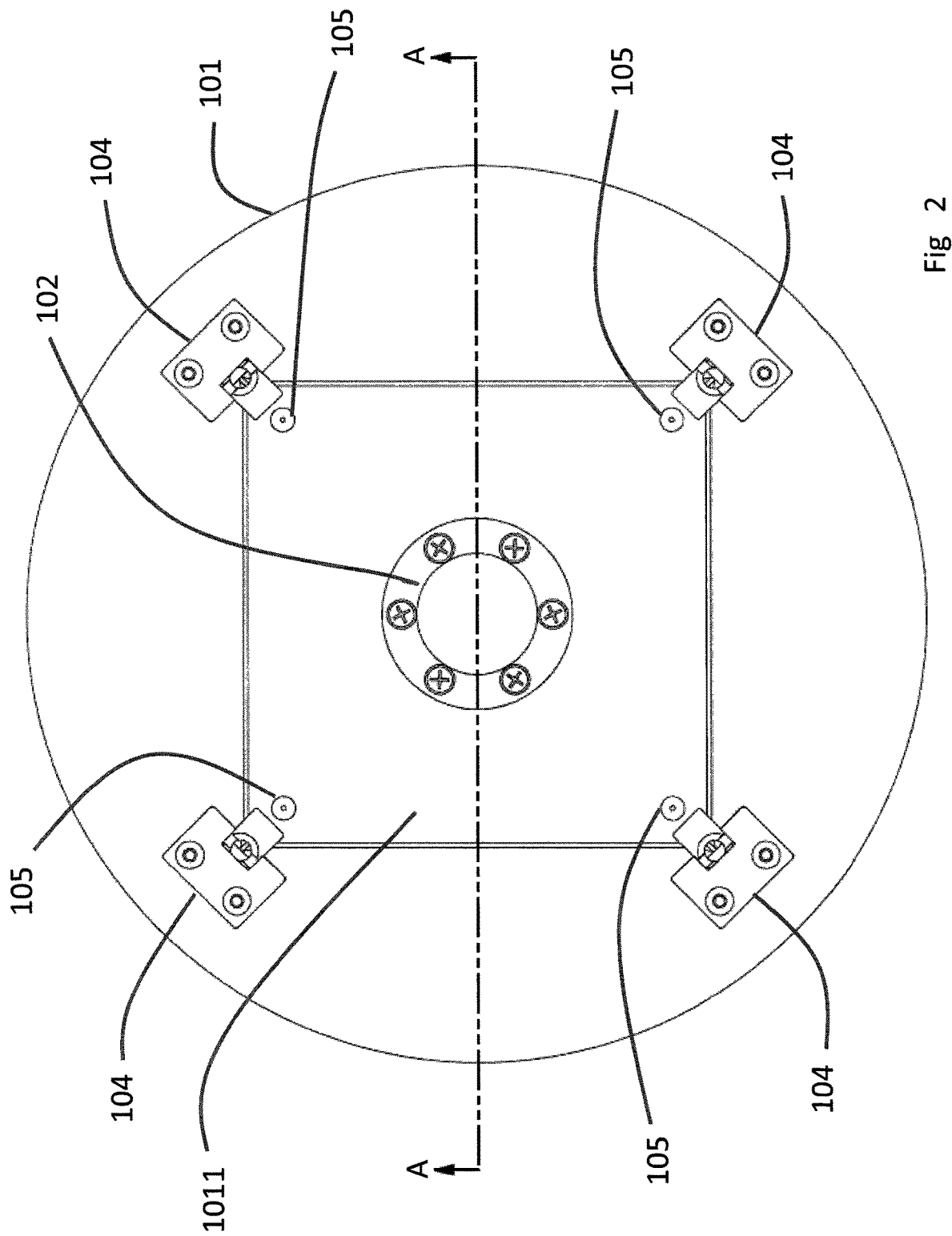
FIG. 2 is a top view of the apparatus shown in FIG. 1.
Figure 3:
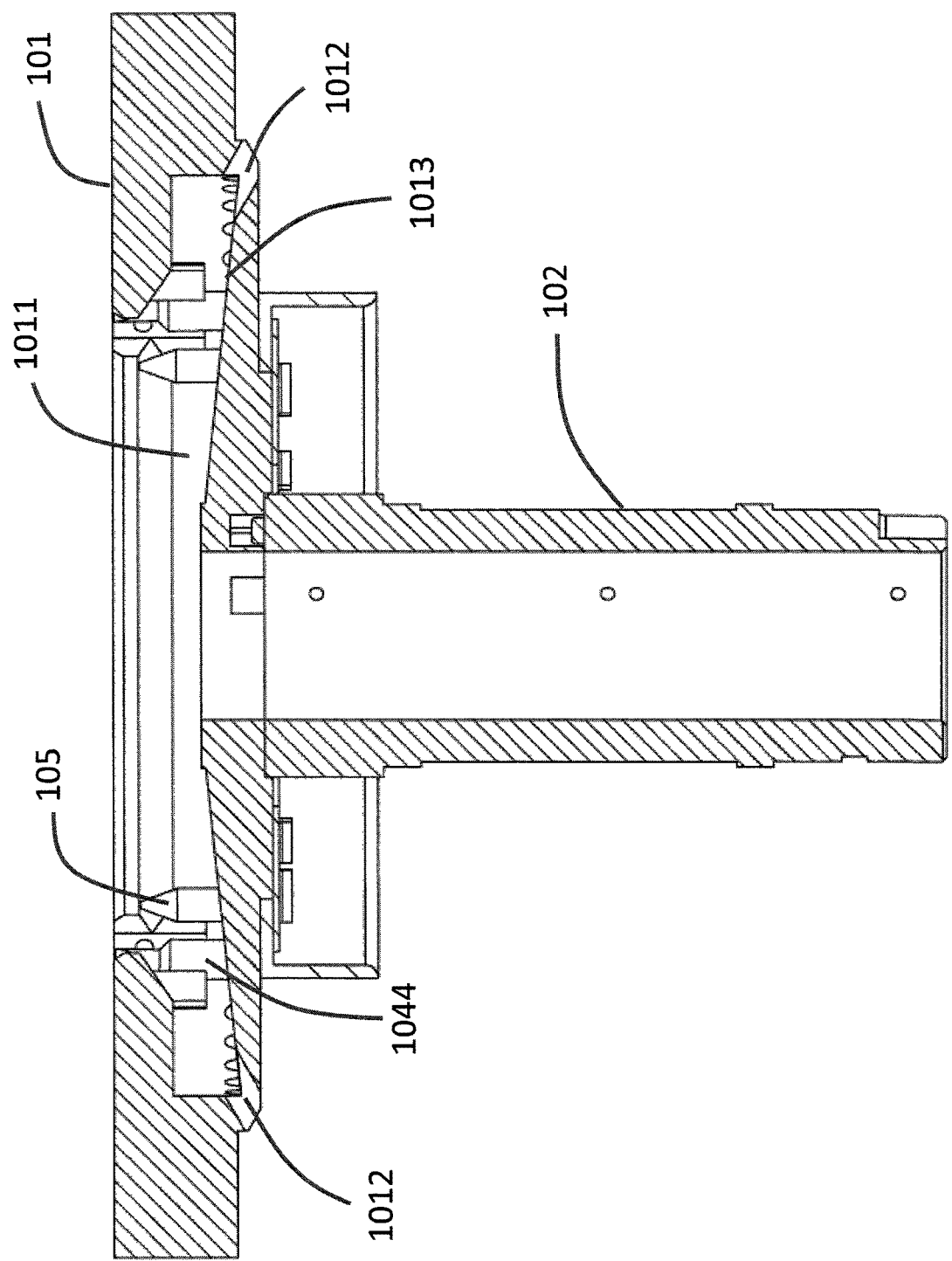
FIG. 3 is a cross-sectional view taken along line A-A of FIG. 2.
Figure 4:
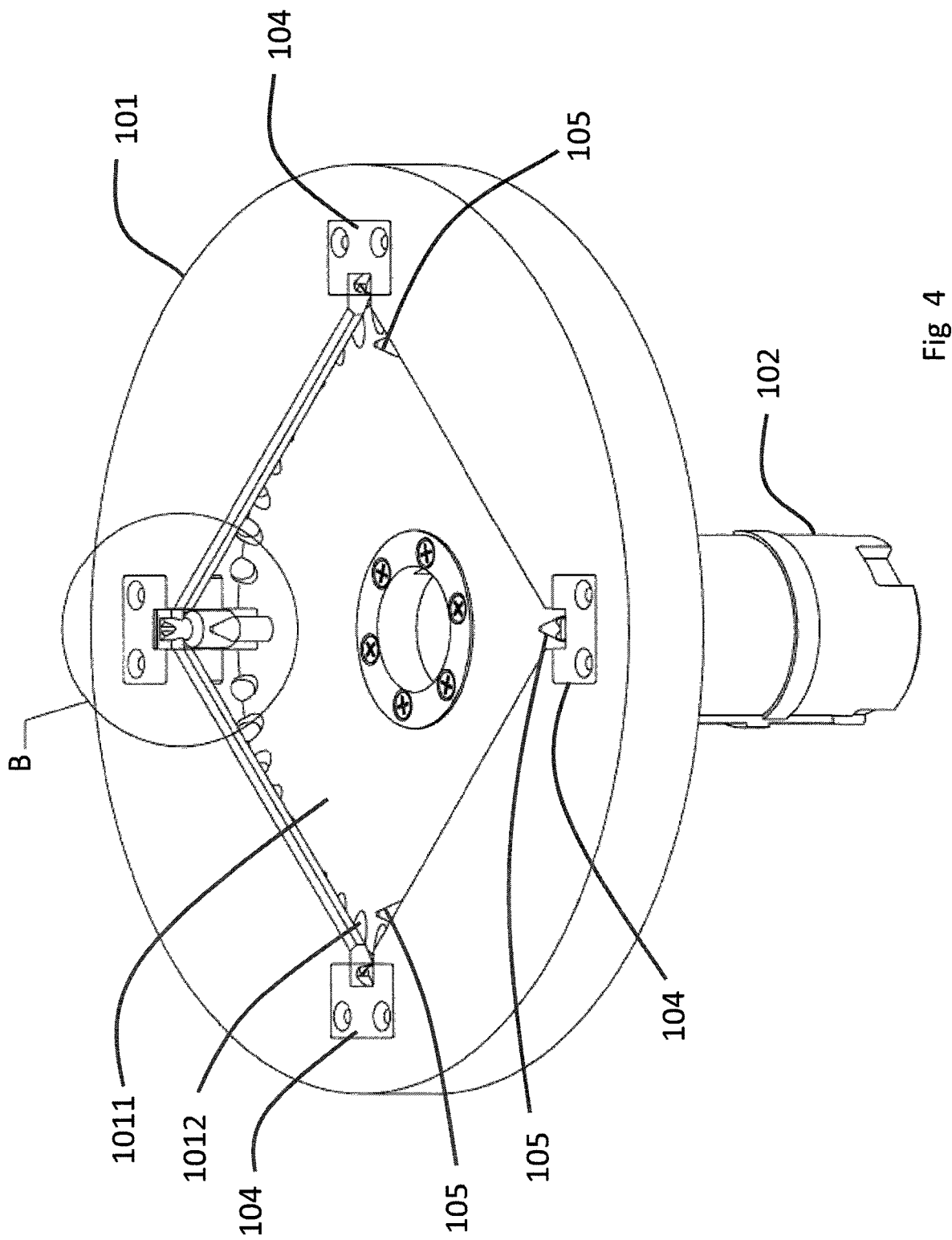
FIG. 4 is a perspective view of the apparatus shown in FIG. 1.
Figure 5:
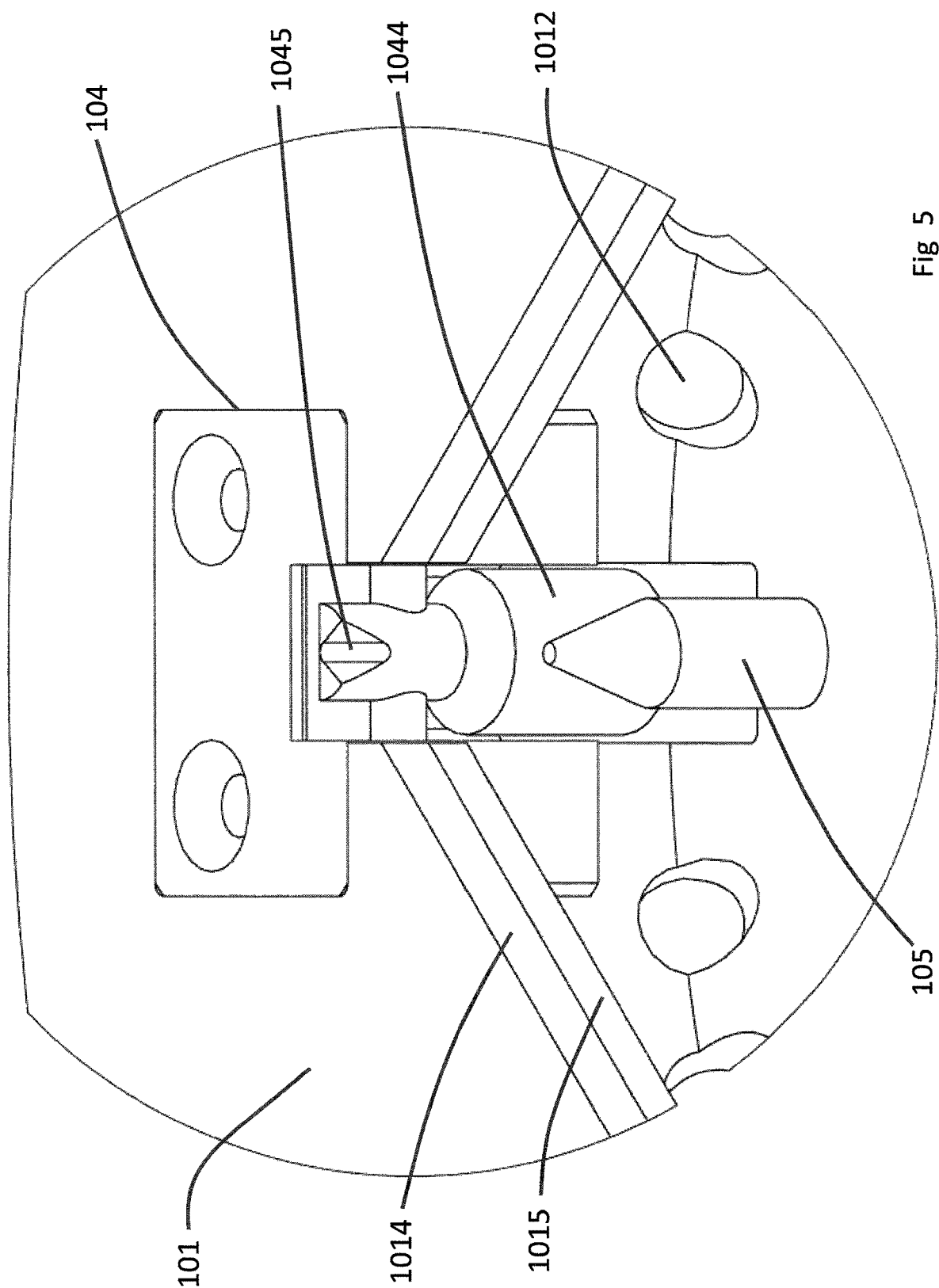
FIG. 5 is a partial enlarged view of a portion B of FIG. 4.

As shown in FIG. 3, the bottom of the chuck 101 defines a plurality of drain holes 1012. The plurality of drain holes 1012 communicate with the receiving cavity 1011. The plurality of drain holes 1012 are arranged in a circle. Every drain hole 1012 has a slope, which is conductive to draining liquid in the receiving cavity 1011. The bottom of the chuck 101 inside the receiving cavity 1011 has a slope surface 1013 which is conductive to the liquid flowing to the drain holes 1012.

When using the apparatus as shown in FIG. 1 to FIG. 11 to clean the mask 103, a robot is used to transfer the mask 103 and place the mask 103 in the receiving cavity 1011 of the chuck 101. There is a distance between side walls of the mask 103 and the vertical planes 1015 of the chuck 101 for facilitating the robot to place the mask 103 in the receiving cavity 1011 of the chuck 101. The distance is in the range of 0.5 mm to 2 mm. Generally, it cannot absolutely guarantee that the robot places the mask 103 in the receiving cavity 1011 of the chuck 101 exactly which means the robot is perpendicular with one vertical plane 1015 of the chuck 101. The robot can deflect an angle, but even so, the mask 103 is still placed in the receiving cavity 1011 of the chuck 101 by the robot. A deflection angle $\theta$ of the robot satisfies the equation: $\tan\theta = d/2^A$, wherein d denotes the distance between side walls of the mask 103 and the vertical planes 1015 of the chuck 101, A denotes the length of side of the mask 103.

The four supporting pins 105 support the mask 103. Preferably, the top surface of the mask 103 and the top surface of the chuck 101 are on the same plane. It should be recognized that the top surface of the mask 103 and the top surface of the chuck 101 can be on different planes. The rotating driving mechanism drives the rotating spindle 102 and the chuck 101 to rotate, making the four clamp pins 1044 clamp the mask 103 by means of centrifugal force. Every corner of the mask 103 is clamped and in the substantial right-angle slot 1045. By this way, the mask 103 is held and positioned in the receiving cavity 1011 of the chuck 101. At least one first nozzle 107 sprays liquid onto the top surface of the mask 103 for cleaning the top surface of the mask 103. An ultra or mega sonic device 106 is disposed above the top surface of the mask 103 and the top surface of the chuck 101 for providing an ultra or mega sonic cleaning to the mask 103. There is a gap formed between the ultra or mega sonic device 106 and the top surface of the mask 103 and the top surface of the chuck 101. The gap is fully and continuously filled with the liquid so that the ultra or mega sonic energy is stably transferred to the top surface of the mask 103 through the liquid. Therefore, the entire top surface of the mask 103 achieves a uniform ultra or mega sonic power density distribution. The liquid in the receiving cavity 1011 is drained out through the plurality of drain holes 1012.

Referring to FIG. 12 to FIG. 18, an apparatus for cleaning substrates using an ultra or mega sonic device according to a second embodiment of the present invention is illustrated. The apparatus includes a chuck 201 and a rotating spindle 202 fixed with the chuck 201. The rotating spindle 202 connects to a rotating driving mechanism. The rotating driving mechanism drives the rotating spindle 202 and the chuck 201 to rotate. The chuck 201 has a receiving cavity 2011 for holding a substrate such as a mask 203. The opening shape of the receiving cavity 2011 is substantially square which matches with the shape of the mask 203. It should be recognized that the opening shape of the receiving cavity 2011 matches with the shape of the substrate which is not limited to the mask 203 and also is not limited to the square shape. The chuck 201 has four vertical planes 2015 which are configured to form the opening of the receiving cavity 2011. Preferably, in order to facilitate placing the mask 203 in the receiving cavity 2011, the chuck 201 has four guiding planes 2014 which respectively connect to the four vertical planes 2015.

The rotating spindle 202 is hollow and fixed at the center of the bottom of the chuck 201. The center of the bottom of the chuck 201 defines a through-hole 2016. The through-hole 2016 communicates with the receiving cavity 2011 and the hollow rotating spindle 202. A second nozzle 210 passes through the through-hole 2016 of the chuck 201 and the hollow rotating spindle 202 for cleaning the bottom surface of the mask 203. A top end of the second nozzle 210 passes through the through-hole 2016 of the chuck 201 and is received in the receiving cavity 2011. A bottom end of the second nozzle 210 passes through the hollow rotating spindle 202. The second nozzle 210 has three liquid channels 2101 extending from the bottom end of the second nozzle 210 to the top end of the second nozzle 210 and penetrating the top end of the second nozzle 210 for spraying liquid onto the bottom surface of the mask 203 so as to clean the bottom surface of the mask 203. Corresponding to every liquid channel 2101, the bottom end of the second nozzle 210 defines an inlet 2102 for supplying the liquid to the liquid channel 2101. It should be recognized that the number of the liquid channel 2101 is not limited to three. Any number of the liquid channel 2101 that can meet the process requirement is acceptable. During the cleaning process, the second nozzle 210 is non-rotating. Comparing to the apparatus disclosed in the first embodiment of the present invention, the apparatus disclosed in the second embodiment of the present invention realizes the double sides cleaning of the mask 203.

Four clamp devices 204 are mounted on the chuck 201 and located at four corners of the receiving cavity 2011 for clamping the mask 203. Every clamp device 204 has a pedestal which is fixed on the chuck 201. The pedestal defines an opening, and a shaft transversely passes through the opening and two ends of the shaft are fixed on the pedestal. A clamp pin 2044 is hung on the shaft. The clamp pin 2044 is located at the opening and can rotate around the shaft. The top end of the clamp pin 2044 defines a substantial right-angle slot for matching with the corner of the mask 203. The interior of the clamp pin 2044 sets a heavy block of which material is stainless steel. The density of the material which is made for the clamp pin 2044 is lower than the density of the material which is made for the heavy block. When the rotating speed of the chuck 201 is higher than a threshold, the clamp pin 2044 clamps the mask 203 by means of centrifugal force. When the rotating speed of the chuck 201 is lower than the threshold, the clamp pin 2044 returns to its original position by its own gravity and releases the mask 203. Four supporting pins 205 are disposed in the receiving cavity 2011 of the chuck 201 for supporting the mask 203. The four supporting pins 205 are located at the four corners of the receiving cavity 2011 and corresponding to the four clamp pins 2044.

Figure 14:
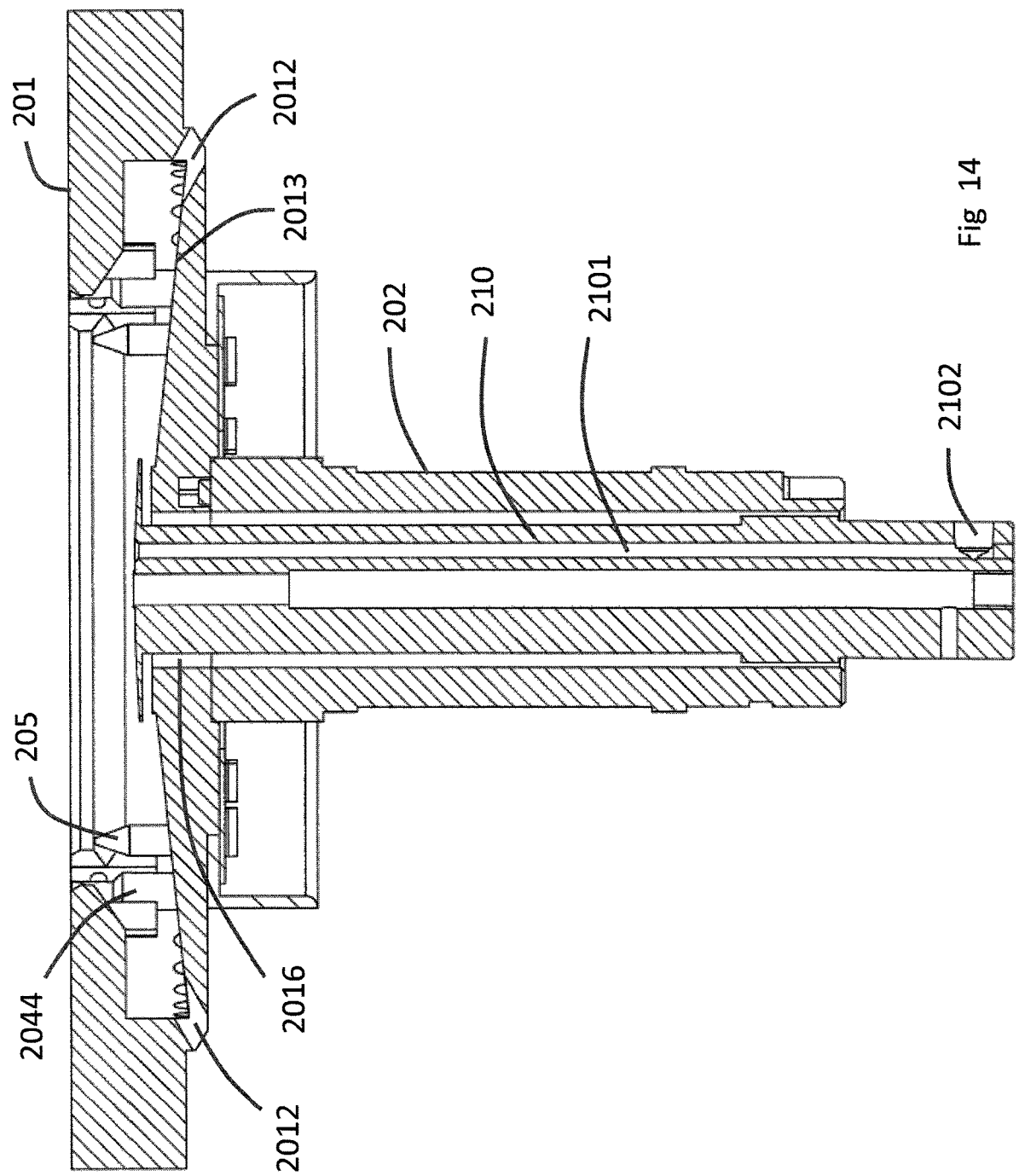
FIG. 14 is a cross-sectional view taken along line E-E of FIG. 13.
Figure 15:
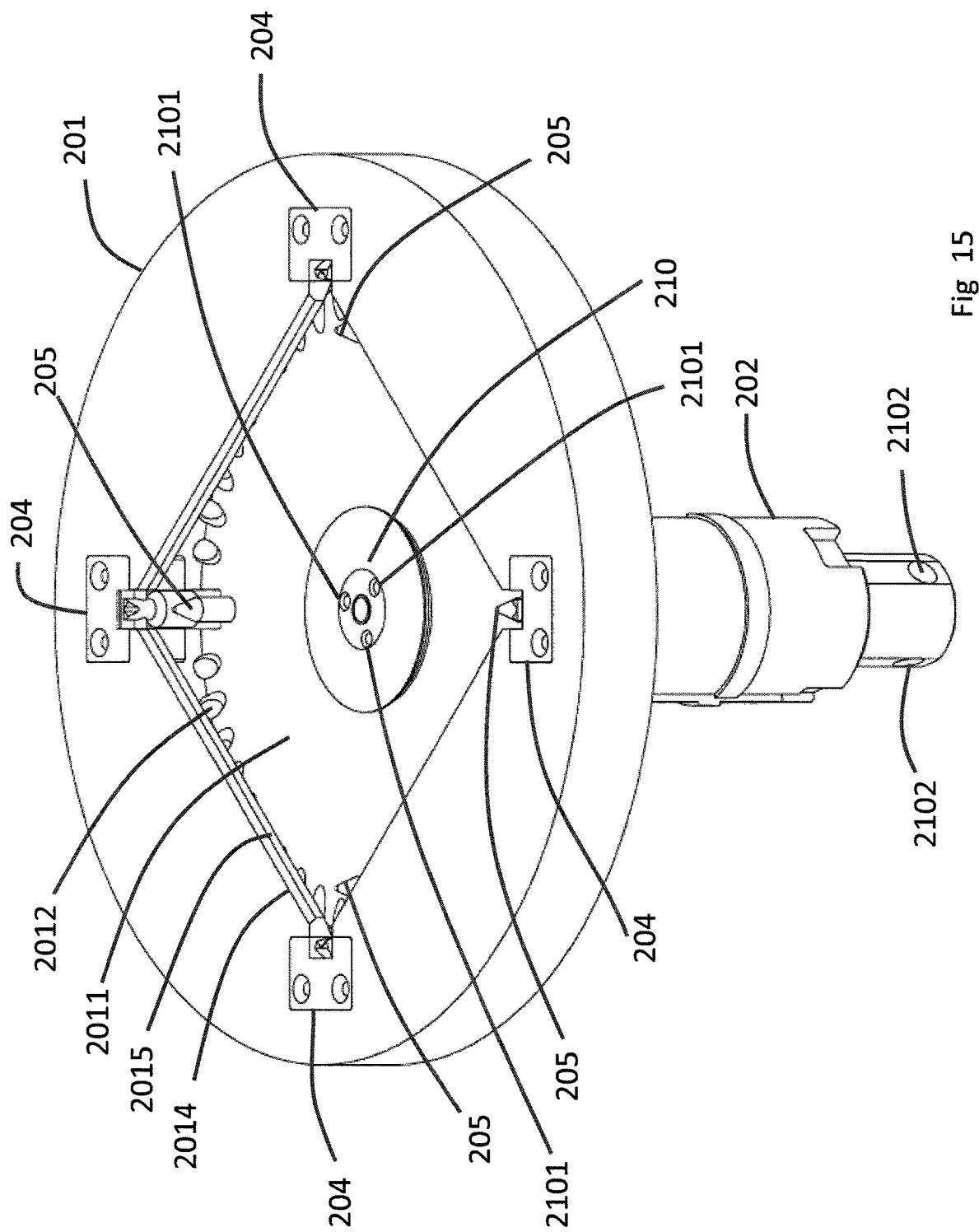
FIG. 15 is a perspective view of the apparatus shown in FIG. 12.
Figure 16:
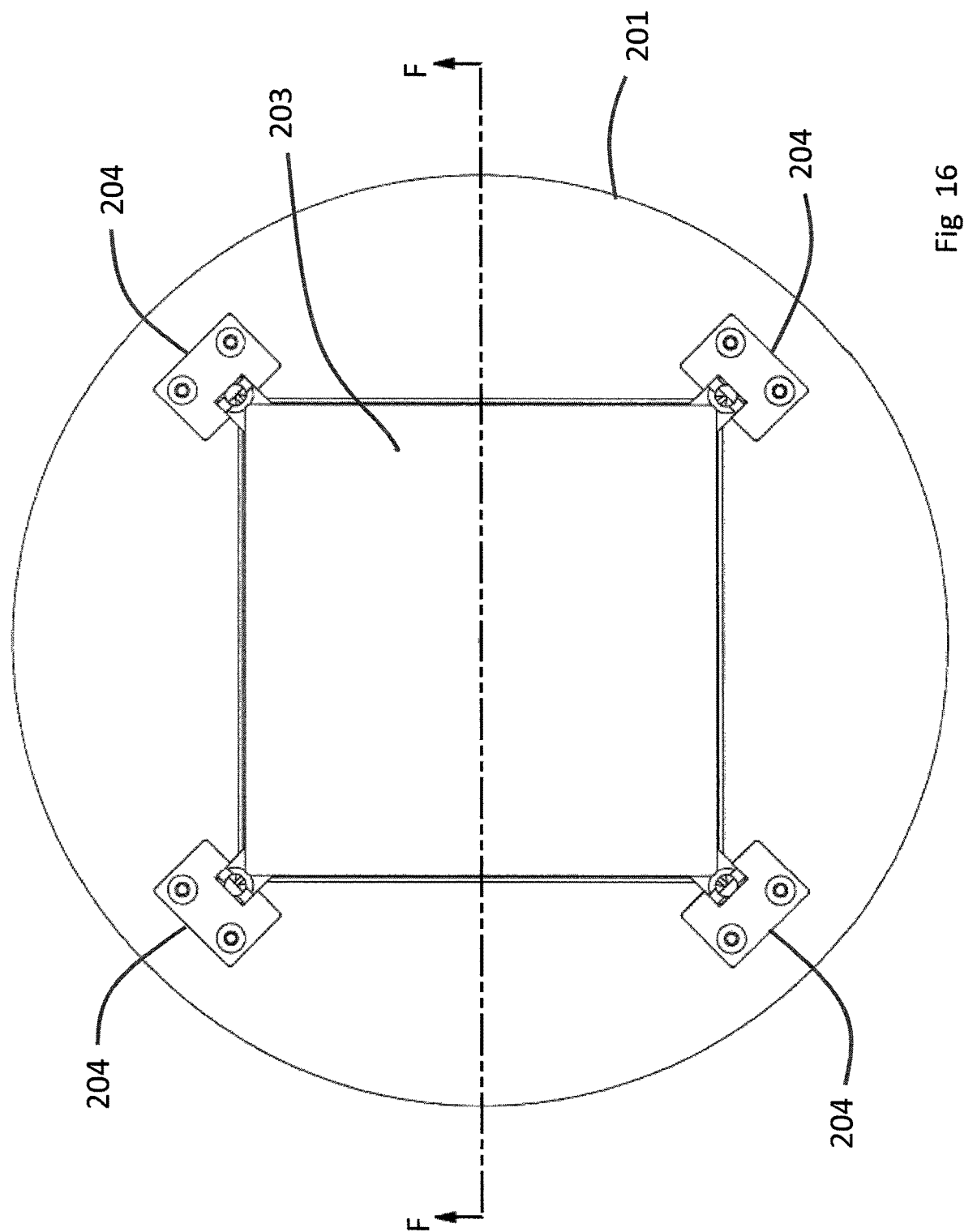
FIG. 16 is a top view of the apparatus used for cleaning a mask according to the second exemplary embodiment of the present invention.
Figure 17:
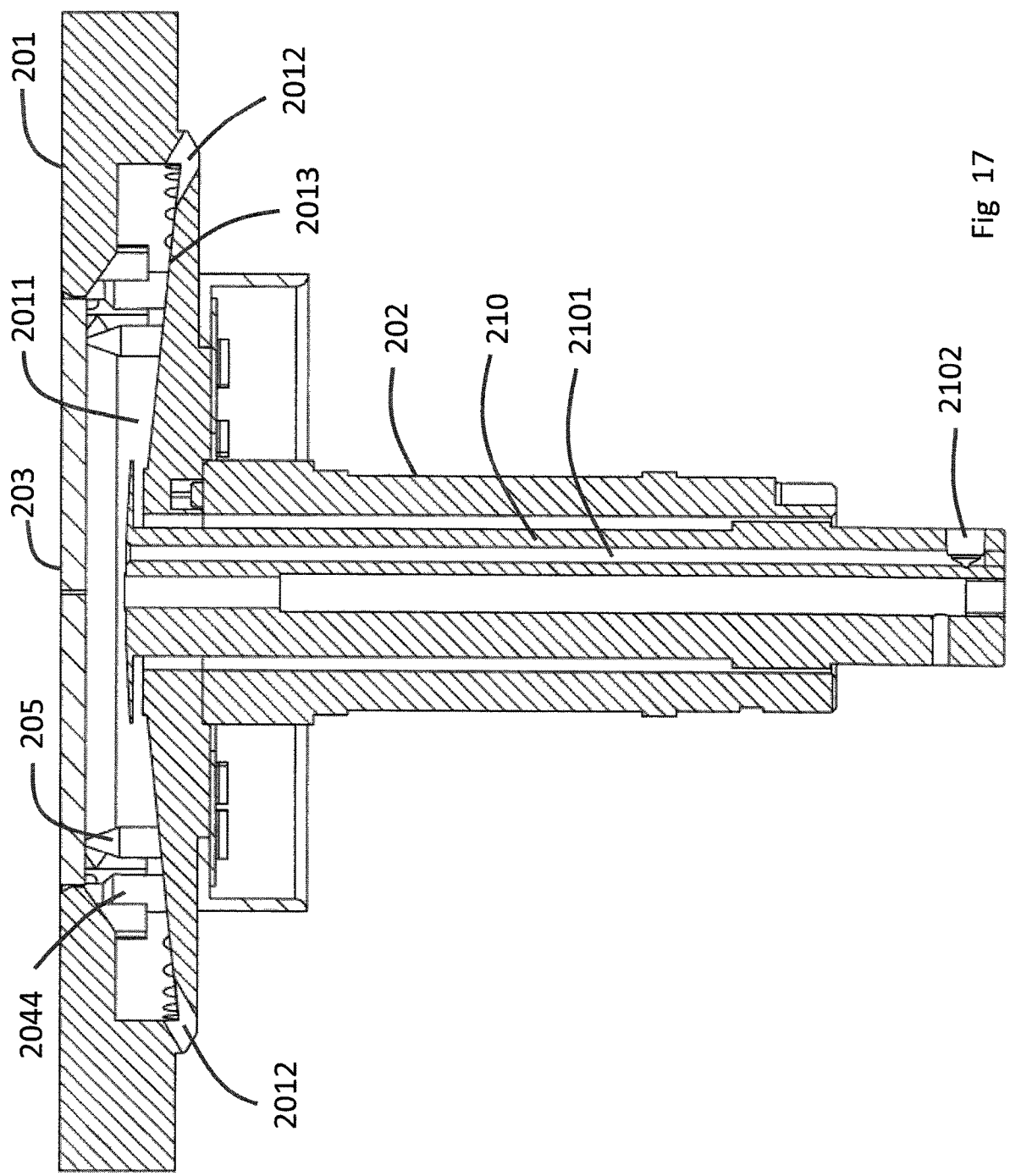
FIG. 17 is a cross-sectional view taken along line F-F of FIG. 16.
Figure 18:
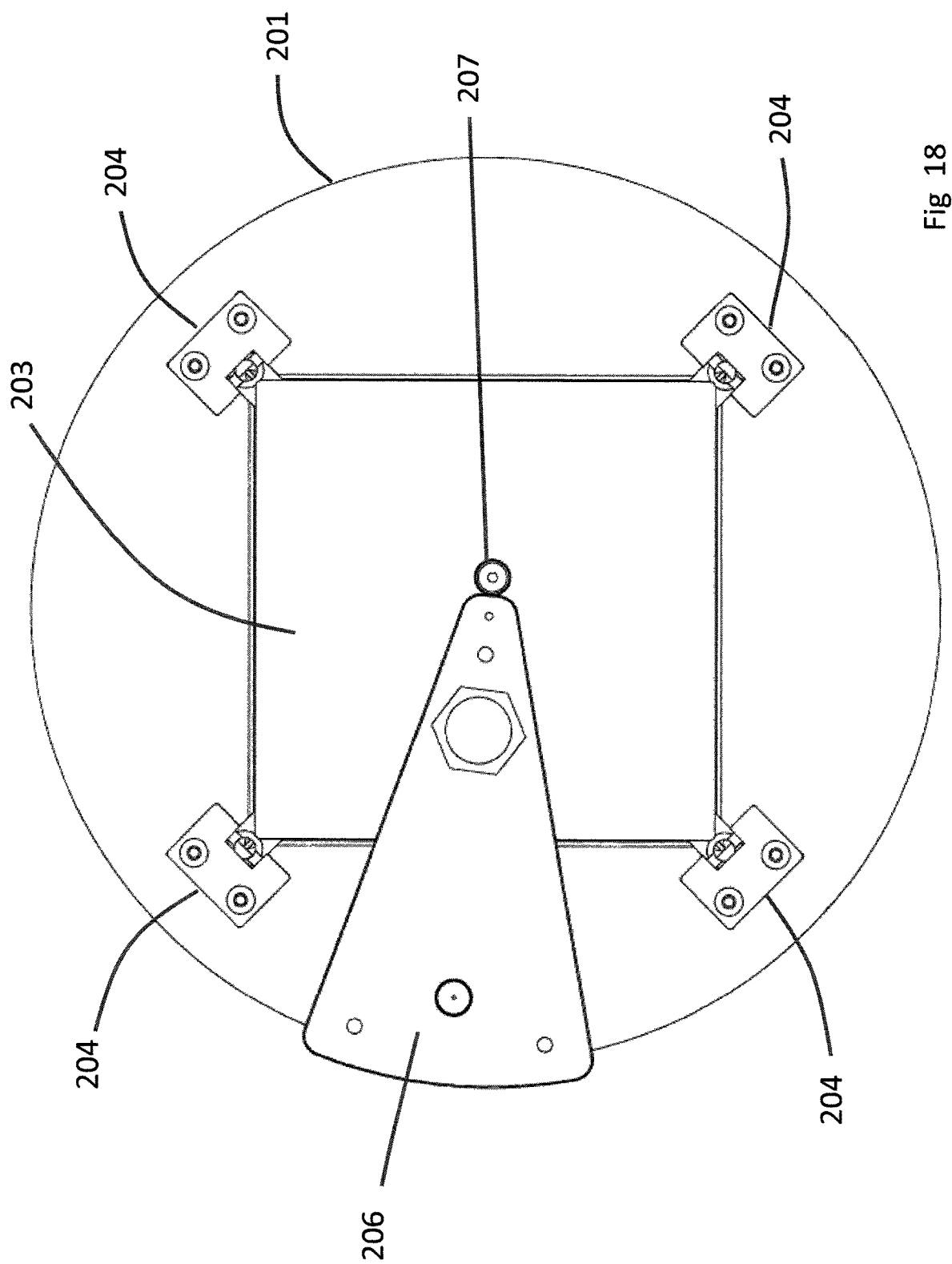
FIG. 18 is a top view of the apparatus combined with an ultra or mega sonic device for cleaning the mask according to the second exemplary embodiment of the present invention.

As shown in FIG. 14, the bottom of the chuck 201 defines a plurality of drain holes 2012. The plurality of drain holes 2012 communicate with the receiving cavity 2011. The plurality of drain holes 2012 are arranged in a circle. Every drain hole 2012 has a slope which is conductive to draining the liquid in the receiving cavity 2011. The bottom of the chuck 201 inside the receiving cavity 2011 has a slope surface 2013 which is conductive to the liquid flowing to the drain holes 2012.

When using the apparatus as shown in FIG. 12 to FIG. 18 to clean the mask 203, a robot is used to transfer the mask 203 and place the mask 203 in the receiving cavity 2011 of the chuck 201. There is a distance between side walls of the mask 203 and the vertical planes 2015 of the chuck 201 for facilitating the robot to place the mask 203 in the receiving cavity 2011 of the chuck 201. The distance is in the range of 0.5 mm to 2 mm. Generally, it cannot absolutely guarantee that the robot places the mask 203 in the receiving cavity 2011 of the chuck 201 exactly which means the robot is perpendicular with one vertical plane 2015 of the chuck 201. The robot can deflect an angle, but even so, the mask 203 is still placed in the receiving cavity 2011 of the chuck 201 by the robot. A deflection angle θ of the robot satisfies the equation: $\tan\theta = d/2^A$, wherein d denotes the distance between side walls of the mask 203 and the vertical planes 2015 of the chuck 201, A denotes the length of side of the mask 203.

The four supporting pins 205 support the mask 203. Preferably, the top surface of the mask 203 and the top surface of the chuck 201 are on the same plane. It should be recognized that the top surface of the mask 203 and the top surface of the chuck 201 can be on different planes. The rotating driving mechanism drives the hollow rotating spindle 202 and the chuck 201 to rotate, making the four clamp pins 2044 clamp the mask 203 by means of centrifugal force. Every corner of the mask 203 is clamped and in the substantial right-angle slot. By this way, the mask 203 is held and positioned in the receiving cavity 2011 of the chuck 201. At least one first nozzle 207 sprays liquid onto the top surface of the mask 203 for cleaning the top surface of the mask 203. An ultra or mega sonic device 206 is disposed above the top surface of the mask 203 and the top surface of the chuck 201 for providing an ultra or mega sonic cleaning to the mask 203. There is a gap formed between the ultra or mega sonic device 206 and the top surface of the mask 203 and the top surface of the chuck 201. The gap is fully and continuously filled with the liquid so that the ultra or mega sonic energy is stably transferred to the top surface of the mask 203 through the liquid. Therefore, the entire top surface of the mask 203 achieves a uniform ultra or mega sonic power density distribution. The second nozzle 210 sprays the liquid onto the bottom surface of the mask 203 for cleaning the bottom surface of the mask 203. The liquid in the receiving cavity 2011 is drained out through the plurality of drain holes 2012.

Figure 19:
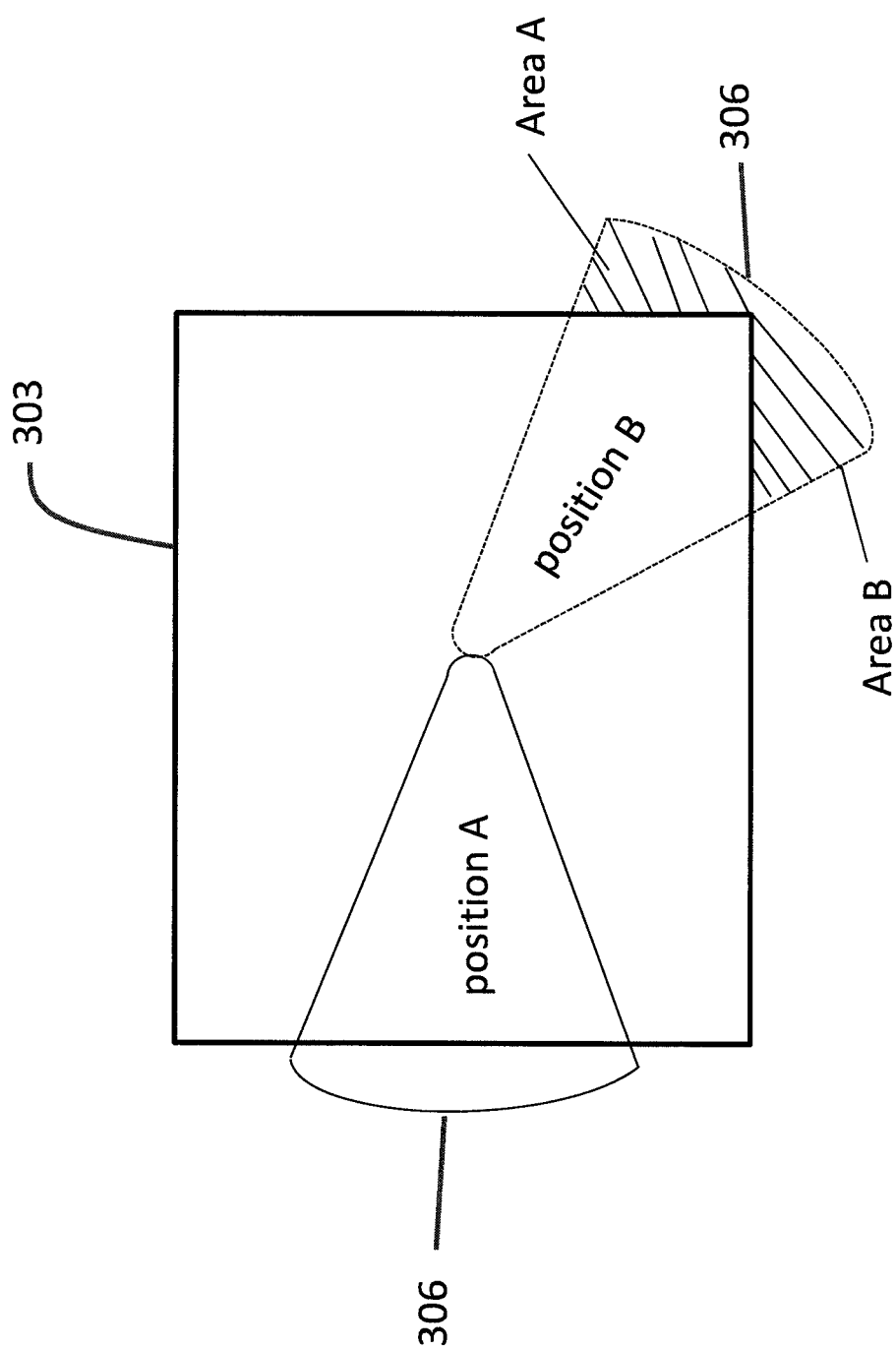
FIG. 19 is a top view of a conventional apparatus combined with an ultra or mega sonic device for cleaning a mask.

As shown in FIG. 19, in a conventional apparatus combined with an ultra or mega sonic device 306 for cleaning a mask 303, Area A and Area B below the ultra or mega sonic device 306 has the liquid off and on during the cleaning process. For example, when the ultra or mega sonic device 306 is at the position A, the liquid fully fills the gap between the ultra or mega sonic device 306 and the top surface of the mask 303, so the Area A and Area B below the ultra or mega sonic device 306 has the liquid. But when the ultra or mega sonic device 306 is at the position B, the Area A and Area B below the ultra or mega sonic device 306 are exposed in the air and there is no liquid at the Area A and Area B. The gas and liquid phases alternating exists at the Area A and Area B. The ultra or mega sonic energy concentrates between the interface of gas and liquid phases. The high ultra or mega sonic power generated by the energy concentration has the risk of the mask 303 damage. Besides, when there is no liquid at the Area A and Area B, where the ultra or mega sonic energy is not transferred to the top surface of the mask 303, but once the Area A and Area B are fully filled with the liquid, the ultra or mega sonic energy is transferred to the top surface of the mask 303 through the liquid. It results in a non-uniform distribution of the ultra or mega sonic energy transferred to the top surface of the mask 303. Besides, the unstable liquid transferring also causes the turbulence flow, where the ultra or mega sonic energy transferring is further not uniform.

For overcoming the above problems, in the present invention, the mask is placed in the receiving cavity of the chuck so that the mask can be seen as a part of the chuck. The size and shape of the chuck is not limited, as long as the underneath of the ultra or mega sonic device is over against the top surface of the mask and the top surface of the chuck and the gap between the ultra or mega sonic device and the top surface of the mask and the top surface of the chuck is fully and continuously filled with the liquid. The entire underneath of the ultra or mega sonic device has the liquid all the time during the cleaning process. The ultra or mega sonic energy is stably transferred to the top surface of the mask through the liquid. Therefore, the entire top surface of the mask achieves a uniform ultra or mega sonic power density distribution, which improves the cleaning effect of the mask, especially improves the cleaning effect of edges of the mask.

The present invention is not limited to the semiconductor field. Besides the semiconductor field, the present invention is also applied to such as LCD, PCB fabrication field.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A substrate cleaning apparatus, comprising:
a chuck assembly for receiving and clamping a substrate, the chuck assembly including a chuck having a receiving cavity for holding the substrate, the receiving cavity being surrounded by a top surface of the chuck;
at least one first nozzle, spraying liquid onto a top surface of the substrate; and
an ultra or mega sonic device, disposed above the top surface of the substrate and the top surface of the chuck for providing an ultra or mega sonic cleaning to the substrate, a gap formed between the ultra or mega sonic device and the top surface of the substrate and the top surface of the chuck, the gap being fully and continuously filled with the liquid so that an entire underneath of the ultra or mega sonic device being filled with the liquid all the time during the cleaning process.

2. The apparatus according to claim 1, wherein the chuck assembly further comprises:
a rotating spindle, fixed with the chuck;
a rotating driving mechanism, connected to the rotating spindle for driving the rotating spindle and the chuck to rotate;
supporting pins, disposed in the receiving cavity of the chuck for supporting the substrate; and
clamp devices, mounted on the chuck for clamping the substrate.

3. The apparatus according to claim 2, wherein the rotating spindle is hollow and fixed at the bottom of the chuck, and the bottom of the chuck defines a through-hole communicating with the receiving cavity and the rotating spindle, a second nozzle passes through the through-hole of the chuck and the rotating spindle for cleaning the bottom surface of the substrate.

4. The apparatus according to claim 3, wherein the second nozzle has at least one liquid channel extending from the bottom end to the top end of the second nozzle and penetrating the top end of the second nozzle for spraying liquid onto the bottom surface of the substrate.

5. The apparatus according to claim 4, wherein corresponding to every liquid channel, the bottom end of the second nozzle defines an inlet for supplying the liquid to the liquid channel.

6. The apparatus according to claim 2, wherein the bottom of the chuck defines a plurality of drain holes, the plurality of drain holes communicate with the receiving cavity.

7. The apparatus according to claim 6, wherein the bottom of the chuck inside the receiving cavity has a slope surface which is conductive to the liquid in the receiving cavity flowing to the drain holes.

8. The apparatus according to claim 2, wherein every clamp device has a clamp pin for clamping the substrate by means of centrifugal force.

9. The apparatus according to claim 2, wherein the opening shape of the receiving cavity matches with the shape of the substrate.

10. The apparatus according to claim 2, wherein the substrate is a mask and the opening shape of the receiving cavity is substantially square.

11. The apparatus according to claim 10, wherein there are four clamp devices mounted on the chuck and located at four corners of the receiving cavity.

12. The apparatus according to claim 11, wherein every clamp device has a clamp pin, the top end of the clamp pin defines a substantial right-angle slot for clamping the corner of the mask.

13. The apparatus according to claim 11, wherein there are four supporting pins located at the four corners of the receiving cavity and corresponding to the four clamp devices.

14. The apparatus according to claim 2, wherein the top surface of the substrate and the top surface of the chuck are on the same plane.

* * * * *